(12) United States Patent
Garg

(10) Patent No.: US 7,541,961 B1
(45) Date of Patent: Jun. 2, 2009

(54) HIGH SPEED, LOW POWER ALL CMOS THERMOMETER-TO-BINARY DEMULTIPLEXER

(75) Inventor: Adesh Garg, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/060,328

(22) Filed: Apr. 1, 2008

(51) Int. Cl.
*H03M 1/34* (2006.01)

(52) U.S. Cl. ............... 341/158; 341/155; 341/96

(58) Field of Classification Search ............ 341/96, 341/155, 156, 158, 160; 36/43; 327/561; 704/504
See application file for complete search history.

(56) References Cited

U.S. PATENT DOCUMENTS 5,382,955 A * 1/1995 Knierim ............... 341/64
5,640,162 A * 6/1997 Lewyn ............... 341/144
6,191,719 B1 * 2/2001 Bult et al. ............... 341/144
6,542,104 B1 * 4/2003 Capofreddi ............... 341/160
6,965,331 B2 * 11/2005 Demartini et al. ............ 341/96

\* cited by examiner

*Primary Examiner*—Brian Young
(74) *Attorney, Agent, or Firm*—Garlick Harrison & Markison; Shayne X. Short

(57) ABSTRACT

High speed, low power all CMOS thermometer-to-binary demultiplexer. A received signal undergoes digital sampling (e.g., as within an ADC) to generate a signal that subsequently undergoes encoding (e.g., transformation from thermometer encoded data to binary encoded data) and de-multiplexing. Two separate de-multiplexing stages are employed when performing combined encoding and de-multiplexing. In addition, the individual DEMUXs of the two stages are clocked using a distributed clock generation architecture, such that, reset and time-interleaving is controlled on the ADC clock generator. The thermometer-to-binary encoders are placed very close to the input stage which facilitates very fast data rates while consuming relatively lower power.

20 Claims, 13 Drawing Sheets

Fig. 5A

| decimal | thermometer | binary |
|---|---|---|
| 0 | 0000000 | 000 |
| 1 | 0000001 | 001 |
| 2 | 0000011 | 010 |
| ooo | ooo | |
| 7 | 1111111 | 111 |

8 values

Fig. 5B

| decimal | thermometer | binary |
|---|---|---|
| 0 | 0000000000 | 0000 |
| 1 | 0000000001 | 0001 |
| 2 | 0000000011 | 0010 |
| ooo | ooo | |
| 10 | 1111111111 | 1010 |

11 values

Fig. 5C

| decimal | thermometer | binary |
|---|---|---|
| 0 | 000000000000000 | 0000 |
| 1 | 000000000000001 | 0001 |
| 2 | 000000000000011 | 0010 |
| ooo | ooo | |
| 15 | 111111111111111 | 1111 |

16 values

Fig. 5D

| decimal | thermometer | binary |
|---|---|---|
| 0 | 0000000000000000000 | 0000 |
| 1 | 0000000000000000001 | 0001 |
| 2 | 0000000000000000011 | 0010 |
| ooo | ooo | |
| 19 | 1111111111111111111 | 10011 |

20 values

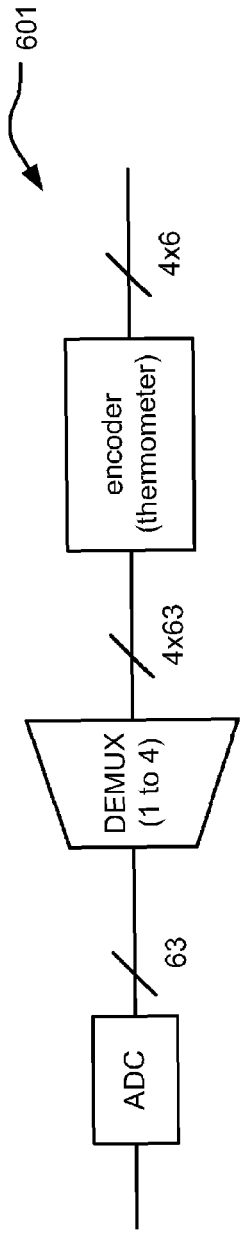
Fig. 6A (prior art)
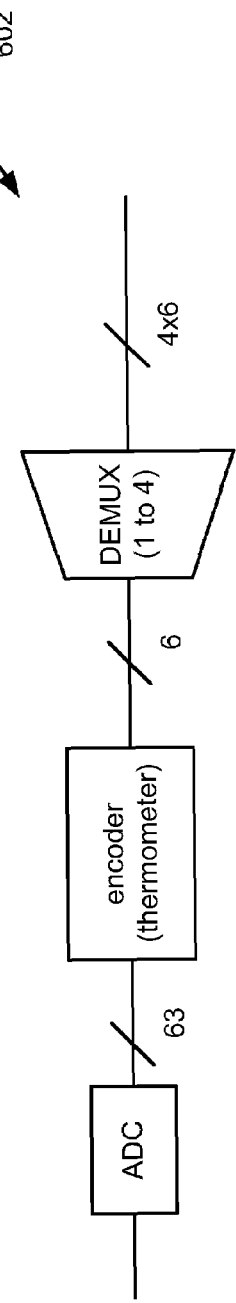
Fig. 6B (ideal, not realizable)

HIGH SPEED, LOW POWER ALL CMOS THERMOMETER-TO-BINARY DEMULTIPLEXER

BACKGROUND OF THE INVENTION

1. Technical Field of the Invention

The invention relates generally to communication systems; and, more particularly, it relates to demultiplexing of signals within such communication systems.

2. Description of Related Art

Data communication systems have been under continual development for many years. Within certain communication systems, different types of coded signals are employed, and it is oftentimes desirable to transform a signal from a first coded signal type to a second coded signal type. One example of this transformation from a first coded signal type to a second coded signal type involves transforming a thermometer encoded signal to a binary coded signal.

The prior art means for performing this thermometer to binary transformation have a number of deficiencies including occupying a significant amount of real estate and also consuming a significant amount of power.

FIG. 6A and FIG. 6B illustrate prior art and ideal, non-realizable embodiments of combined demultiplexing and thermometer encoding.

Referring to the prior art embodiment 601 of FIG. 6A, this traditional architecture of a thermometer-to-binary DEMUX encoder (which can be referred to as a DEMUX encoder) de-multiplexes the thermometer encoded data firstly using a 1 to 4 DEMUX and then performs the thermometer-to-binary encoding thereon using an encoder.

One embodiment of such a prior art architecture uses a 1 to 4 DEMUX which contains 5 latches operating at frequency F, and 10 latches operating at F/2 with the number of bits being 63 through the entire DEMUX. The estimated power consumption, P, is calculated as follows:

$$P=(N_{bits}) \times (\text{\# of latches}) \times (\text{frequency}).$$

$$P=63 \times 5 \times F + 63 \times 10 \times (F/2) = 630F.$$

Referring to the ideal, yet non-realizable embodiment 602 of FIG. 6B, a best approach would be to place the encoder prior to the input of the DEMUX for a potential power savings as calculated as follows:

$$P=(N_{bits}) \times (\text{\# of latches}) \times (\text{frequency}).$$

$$P=6 \times 5 \times F + 6 \times 10 \times (F/2) = 60F.$$

This is a power savings of 90%, but this embodiment 602 is simply not always possible or realizable, especially for high speed applications.

There exists a need in the art for less power consumptive, yet realizable architectures for performing combined de-multiplexing and encoding while supporting increased/higher operational rates and data speeds.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 5A, FIG. 5B, FIG. 5C, and FIG. 5D illustrate various embodiments relating decimal information to thermometer encoded information to binary encoded information.

FIG. 6A and FIG. 6B illustrate prior art and ideal, non-realizable embodiments of combined demultiplexing and thermometer encoding.

DETAILED DESCRIPTION OF THE INVENTION

A novel architecture and approach to performing combined de-multiplexing and encoding is presented herein.

One application context that can employ such architecture may employ high speed time-interleaved flash analog to digital converters (ADCs). In such devices, the act of de-multiplexing the flash comparator outputs and converting the bits from thermometer encoded data to binary encoded data (e.g., from thermometer to binary encoding) can consume a significant portion of the overall ADC power.

The novel architecture and approach presented herein places the thermometer-to-binary encoder as close to the input stage as possible while pushing the functionality after the data has been converted (to a binary format) to a lower number of bits and data rate. This reduces the area, and power consumption of the overall circuit. In addition, the novel architecture removes the timing dependence between each individual DEMUX encoder by placing distributed, local dividers throughout the circuitry for each DEMUX to remove potential race conditions that can arise during reset.

This architecture and approach presented herein can be employed within a wide variety of communication systems, some types of which are described below.

Figure 1:
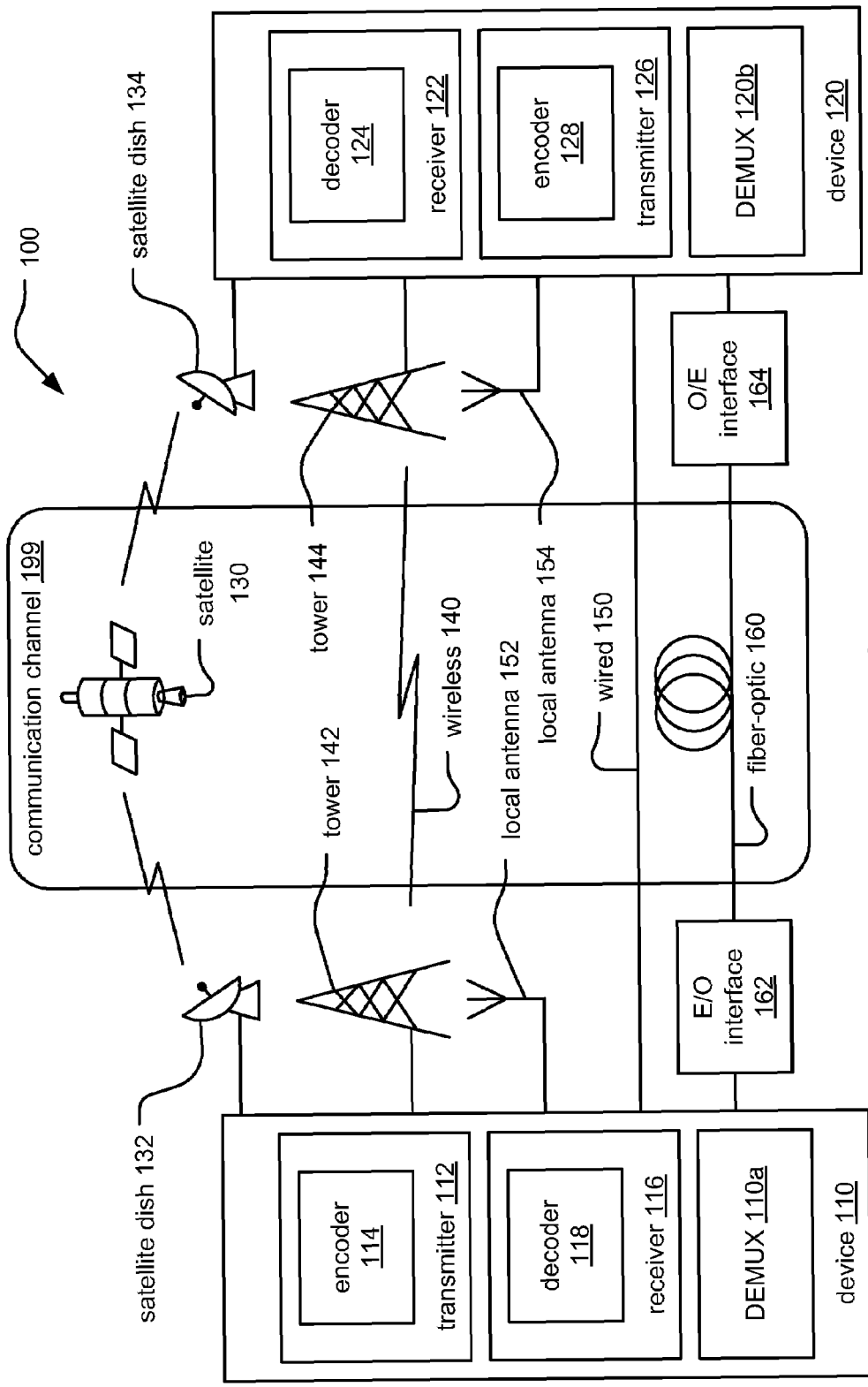
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber (e.g., optical fiber), copper, and/or other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

In addition, more than one type of media may be implemented and interfaced together thereby forming the communication channel 199. It is noted also that either one of both of the communication device 110 and the communication device 120 can include a hard disk drive (HDD) (or be coupled to a HDD).

It is also noted that either one of both of the communication device 110 and the communication device 120 can include a demultiplexer (DEMUX) in accordance with any of the embodiments and/or aspects presented herein. For example, the communication device 110 can include a DEMUX 110a, and the communication device 120 can include a DEMUX 120a.

The signals employed within this embodiment of a communication system 100 can be of any variety of types of signals, including uncoded signals, signals employing uncoded modulation, Reed-Solomon (RS) coded signals, LDPC (Low Density Parity Check) coded signal, turbo coded signals, turbo trellis coded modulation (TTCM), and/or coded signals generated using some other error correction coding (ECC).

Also, any of a very wide variety of applications that perform transferring of signals from one location to another (e.g., including from a first location to a HDD, or from the HDD to another location) can benefit from various aspects of the invention, including any of those types of communication devices and/or communication systems depicted in FIG. 1. Moreover, any other types of devices, methods, and applications that employ a DEMUX, or employ a DEMUX and perform encoding (e.g., including thermometer encoding) of a signal in accordance with any embodiment and/or aspect presented herein can also benefit from various aspects of the invention.

Such a DEMUX 110a or DEMUX 120a, or any embodiment of a DEMUX in accordance with any embodiment and/or aspects described herein, can be implemented anywhere within a device where a signal is being processed. For example, in some applications, it is desirable to perform demultiplexing of a signal to effectuate parallel processing of the individual components of that signal. An incoming signal can be transformed (e.g., de-serialized) into multiple signals such that each of the multiple signals corporately include all information of the incoming signal. In this way, a number of parallel-implemented processors and/or modules can each operate on one of the multiple signals.

Another application may include a device that performs serialization and/or de-serialization (e.g., a SERDES performs both serialization and de-serialization), multiplexing and/or de-multiplexing in which multiple signals need to be processed together. Again, a number of parallel-implemented processors and/or modules could process those signals (e.g., undergoing serialization and/or de-serialization, multiplexing and/or de-multiplexing) during a same time period.

Generally speaking, such a DEMUX can be employed within any device in which a signal is desired to undergo de-multiplexing. Moreover, such a DEMUX can be implemented in cooperation with other processors and/or modules, including encoders (e.g., which could be thermometer encoders implemented to perform thermometer to binary transformations, or vice versa) as well without departing from the scope and spirit of the invention.

Figure 2:
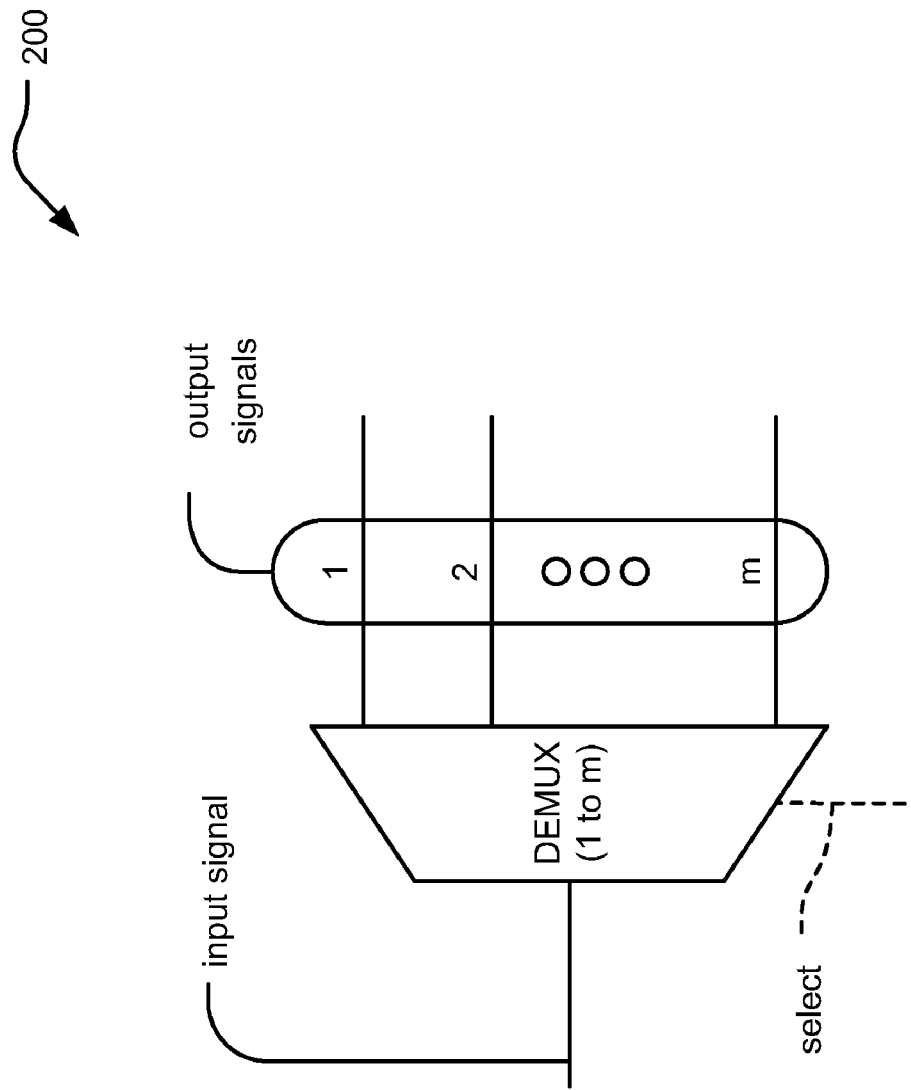
FIG. 2 illustrates an embodiment of a demultiplexer (DEMUX).

FIG. 2 illustrates an embodiment of a demultiplexer (DEMUX) 200. The DEMUX 200 receives an input signal, and generates a number of output signals (depicted as 1, 2, . . . , up to m, where m is an integer). Also, a select signal can be employed to select one of the output signals at a particular time. In some embodiments, different of output signals are selected at different times (e.g., output signal 1 at time 1, output signal 2 at time 2, and so on) as directed by the select signal that may itself be changing as a function of time.

Such a DEMUX 200 may be implemented within any of a wide variety of applications including a de-serializer that receives a serial signal and generates a parallel signal (e.g., the output signal 1-$m$) that includes all of the information within the serial signal. This may be viewed as being a serial to parallel conversion.

Another application in which the DEMUX 200 may be implemented is an apparatus that performs thermometer to binary encoding in which a thermometer encoded signal undergoes transformation to generate a binary encoded signal. Various embodiments depicting this form of processing are described herein.

Figure 3:
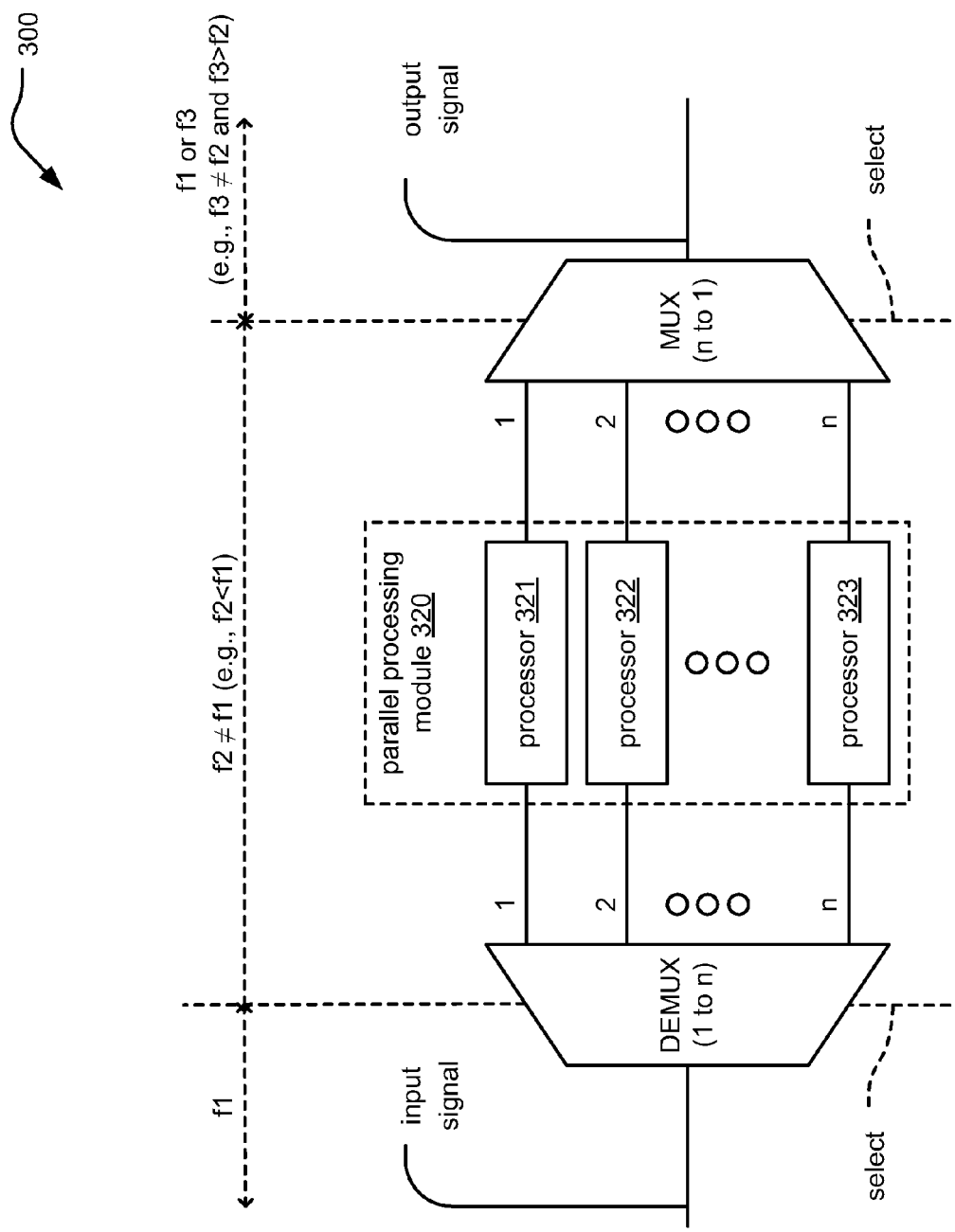
FIG. 3 illustrates an embodiment of a DEMUX and a multiplexer (MUX) implemented to support parallel processing of an input signal.

FIG. 3 illustrates an embodiment of a DEMUX and a multiplexer (MUX) implemented to support parallel processing 300 of an input signal. This is yet another application in which a DEMUX (shown as being a 1 to n DEMUX) may be implemented. A DEMUX receives an input signal, and generates a number of output signals (depicted as 1, 2, up to n, where n is an integer). Also, a select signal can be employed to select one of the output signals at a particular time. In some embodiments, different of output signals are selected at different times (e.g., output signal 1 at time 1, output signal 2 at time 2, and so on) as directed by the select signal that may itself be changing as a function of time.

A parallel processing module 320, that includes a number of processors (e.g., as shown by processor 321, processor 322, and up to processor 323, that considered together may be more than 3 processors), operates on each of the signals output from the DEMUX. This parallel operation on each of the signals output from the DEMUX allows the ability to process each of these individual signals at a slower rate (e.g., using a lower frequency and/or clock) that the rate at which the input signal is received while still maintaining a common, steady state flow of information through the system. For example, the frequency at which the parallel processing module 320 operates may be a frequency f2, that is different from a frequency f1 at which the input signal is received or processed, and the frequency f2 may be less than the frequency f1.

After being processing within the parallel processing module 320, the signals output there from can be provided to a MUX that (shown as being an n to 1 MUX) combines the signals received by the MUX it and/or selects one of the signals received by the MUX. The output signal may then be processed within a domain having the frequency f1 or a frequency f3 that is different from the frequency f2 and the frequency f1. The frequency f3 may be greater than the frequency f2.

This diagram shows yet another embodiment in which a DEMUX (and/or a MUX) may be employed. Generally speaking, the various embodiments of a DEMUX as described herein can be employed within any desired device various types of communication devices where the generation of multiple output signals from one or more input signals is being performed. For example, while many of the embodiments depicted herein show a DEMUX that received only 1 input signals, it is noted that the principles and aspects presented herein may also be applied to a DEMUX that receives more than one input signal (e.g., 2 or more input signals).

It is also noted that, in an alternative embodiment, the MUX need not be implemented. For example, an input signal can be processed to generate the output signals (depicted as 1, 2, up to n, where n is an integer) for subsequent parallel processing within the parallel processing module 320. This alternative embodiment could be similar to what is depicted in the diagram with at least one difference being that these parallel signals processed by the parallel processing module 320 are not provided to the MUX.

Figure 4:
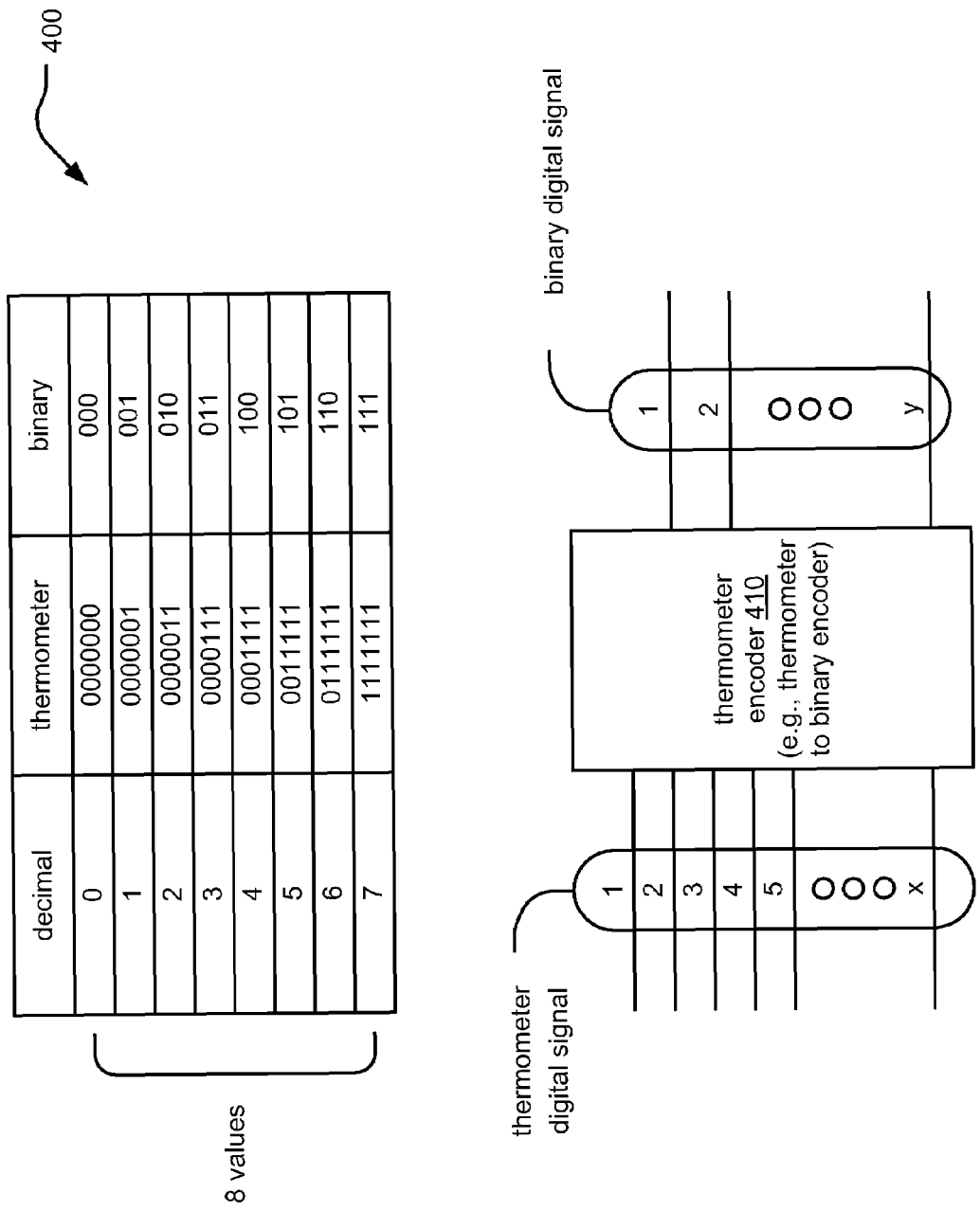
FIG. 4 illustrates an embodiment of thermometer encoding.

FIG. 4 illustrates an embodiment of thermometer encoding 400. Generally speaking, a thermometer encoded signal has analogous properties of a thermometer employed for measuring temperature as is generally known. For example, considering the table at the top of the diagram, an embodiment including 8 distinct values are shown with reference to their decimal counterparts (e.g., 0, 1, 2, and so on to 7).

Since this embodiment includes 8 distinct values, then 7 distinct bits are employed in the thermometer encoded signal to represent all of these 8 distinct values decimal counterparts. Each individual bit of the corresponding thermometer encoded signal values are employed to represent its decimal counterpart as follows:

0 in decimal is represented in thermometer encoding as 7 successive 0s.

1 in decimal is represented in thermometer encoding as a 1 located in the least significant bit (LSB) location preceded by all 0s in the 6 other bit positions.

2 in decimal is represented in thermometer encoding as a 1 located in the two LSB locations preceded by all 0s in the 5 other bit positions.

3 in decimal is represented in thermometer encoding as a 1 located in the three LSB locations preceded by all 0s in the 4 other bit positions.

The remainder of the correspondence can be seen in the diagram.

As can be seen, 1 bit position is made to be a value of 1 in a thermometer encoded signal to generate a corresponding 1 (decimal) valued signal.

As can be seen, 2 bit positions are made to be a value of 1 in a thermometer encoded signal to generate a corresponding 2 (decimal) valued signal.

As can be seen, 3 bit positions are made to be a value of 1 in a thermometer encoded signal to generate a corresponding 3 (decimal) valued signal.

The thermometer encoded signal output may be viewed as being a corresponding cumulative signal, in that, each successively larger number includes all 1 valued bits in the lower significant bit locations as each smaller number than it. For example, 1 (decimal), when represented in a thermometer encoded signal, includes a 1 valued bit in the least significant bit location. 2 (decimal), when represented in a thermometer encoded signal, includes 1 valued bits in the least significant bit location and the next more significant bit location, and 2 (decimal), when represented in a thermometer encoded signal, includes 1 valued bits in the least significant bit location and in the next 2 more significant bit location.

FIG. 5A, FIG. 5B, FIG. 5C, and FIG. 5D illustrate various embodiments relating decimal information to thermometer encoded information to binary encoded information.

Referring to FIG. 5A, an embodiment of a thermometer code that includes 7 distinct digits (8 distinct values, in that, all bits being 0 is actually 0) is shown.

Referring to FIG. 5B, an embodiment of a thermometer code that includes 10 distinct digits (11 distinct values, in that, all bits being 0 is actually 0) is shown.

Referring to FIG. 5C, an embodiment of a thermometer code that includes 15 distinct digits (16 distinct values, in that, all bits being 0 is actually 0) is shown.

Referring to FIG. 5D, an embodiment of a thermometer code that includes 19 distinct digits (20 distinct values, in that, all bits being 0 is actually 0) is shown.

As can be seen, transforming thermometer encoded information to binary encoded information need not only include a total number of distinct values such that the largest valued binary need not be composed of all 1s.

For more detailed description of the prior art embodiments of FIG. 6A and FIG. 6B, the reader is directed to the "DESCRIPTION OF RELATED ART" section herein.

FIG. 6A and FIG. 6B illustrate prior art and ideal, non-realizable embodiments of combined demultiplexing and thermometer encoding.

Figure 7:
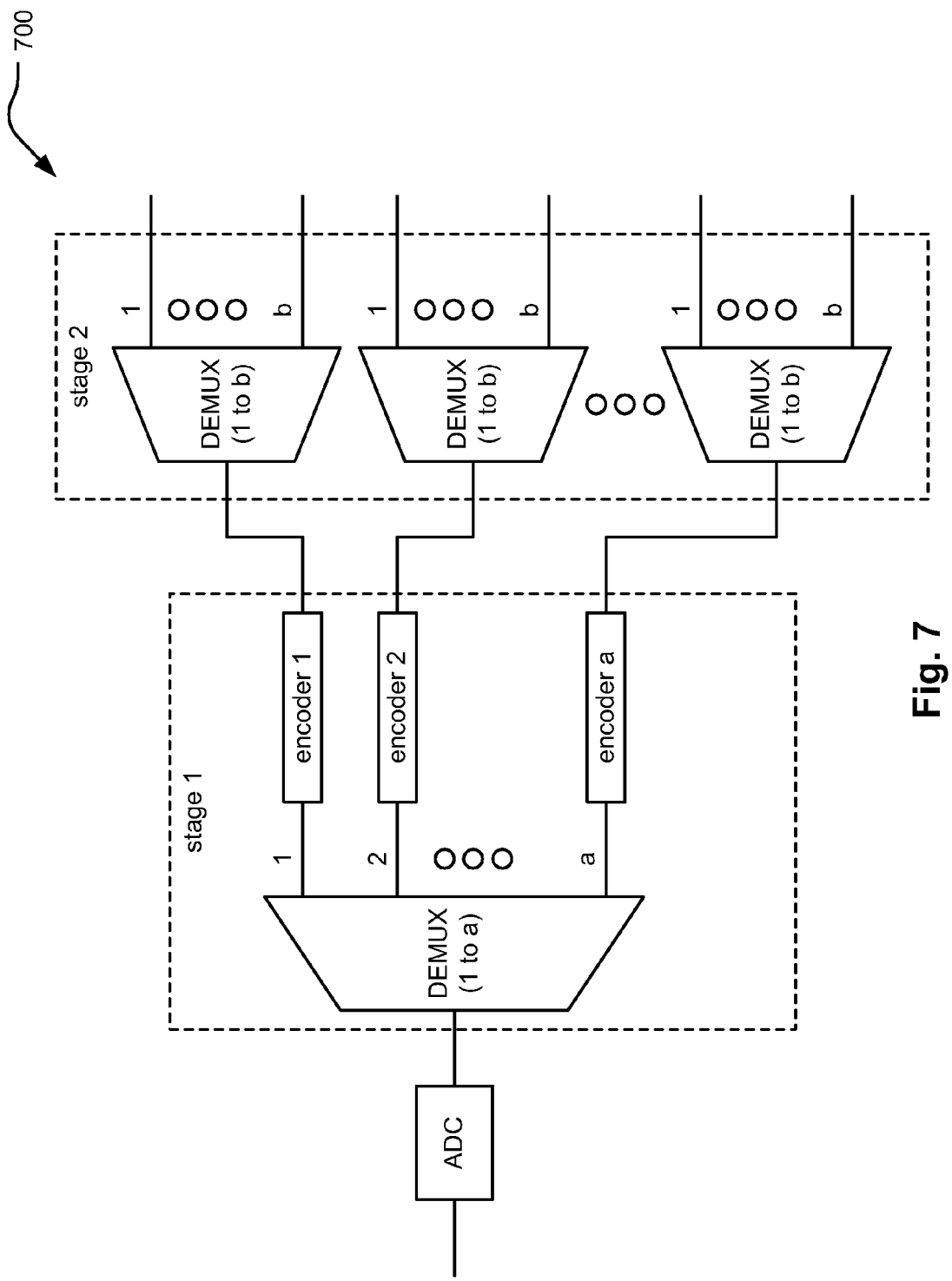
FIG. 7 illustrates an embodiment of a multi-stage demultiplexing and encoding.

FIG. 7 illustrates an embodiment of a multi-stage demultiplexing and encoding 700. This embodiment includes an analog to digital converter (ADC) samples an incoming analog signal at some sampling rate to generate a digital signal. The digital signal is then provided to a DEMUX (shown as performing a '1 to a' transformation, in which a is an integer). Each of the signals output from the DEMUX is provided to a corresponding encoder (e.g., shown as encoder 1, encoder 2, and up to encoder a). A stage 1 includes the first DEMUX (1 to a) and each of the encoders 1-*a*. A stage 2 includes a number of DEMUXs (each shown as performing a '1 to b' transformation, in which b is an integer). It is noted that alternative embodiments could include a number of DEMUXs such that each DEMUX could perform a different transformation, e.g., a '1 to b' transformation, a '1 to c' transformation, a '1 to d' transformation, etc., in which b, c, d, etc. are integers).

The stage 2 of this embodiment includes the DEMUXs (that each perform the 1 to b transformation) to generate a number of output signals.

If desired in some embodiments, the ADC can sample its incoming signal at a first clock, and the elements within stage 1 can operate at a second clock. The elements in the stage 2 can also operate at a third clock as well without departing from the scope and spirit of the invention.

In even certain embodiments, the encoders 1-*a* may be thermometer encoders that process thermometer coded data thereby generating binary coded data.

Figure 8:
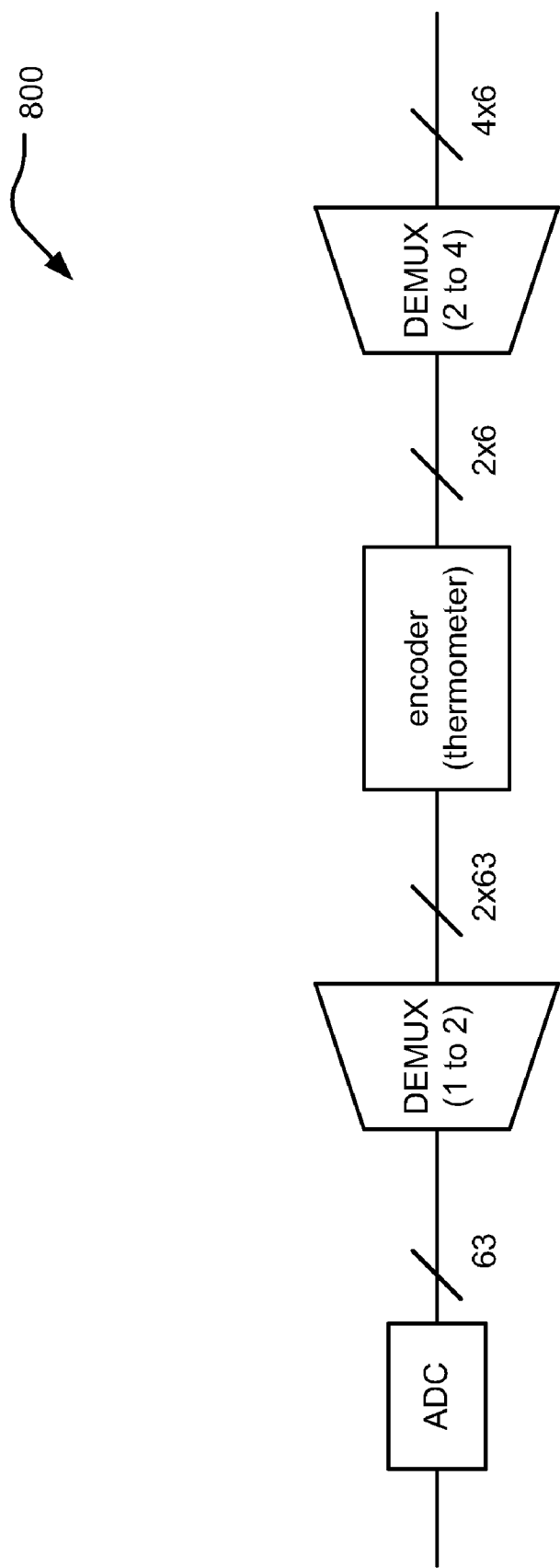
FIG. 8 illustrates an alternative embodiment of a multi-stage demultiplexing and encoding.

FIG. 8 illustrates an alternative embodiment of a multi-stage demultiplexing and encoding 800. Comparing this embodiment to the prior art embodiment of FIG. 6A that employs 5 latches and outputs the data on a common clock edge, this alternate architecture is to push the encoder into the DEMUX path to reduce the number of latches needed for the lower DEMUX stages.

Performing analogous power calculations as shown above, the estimated power for this embodiment is as follows:

$P=(N_{bits})\times(\text{\# of latches})\times(\text{frequency})$.

$P=63\times5\times F+6\times10\times(F/2)=375F.$

This is a power savings of 45% compared to the prior art embodiment 601 of FIG. 6A.

Figure 9:
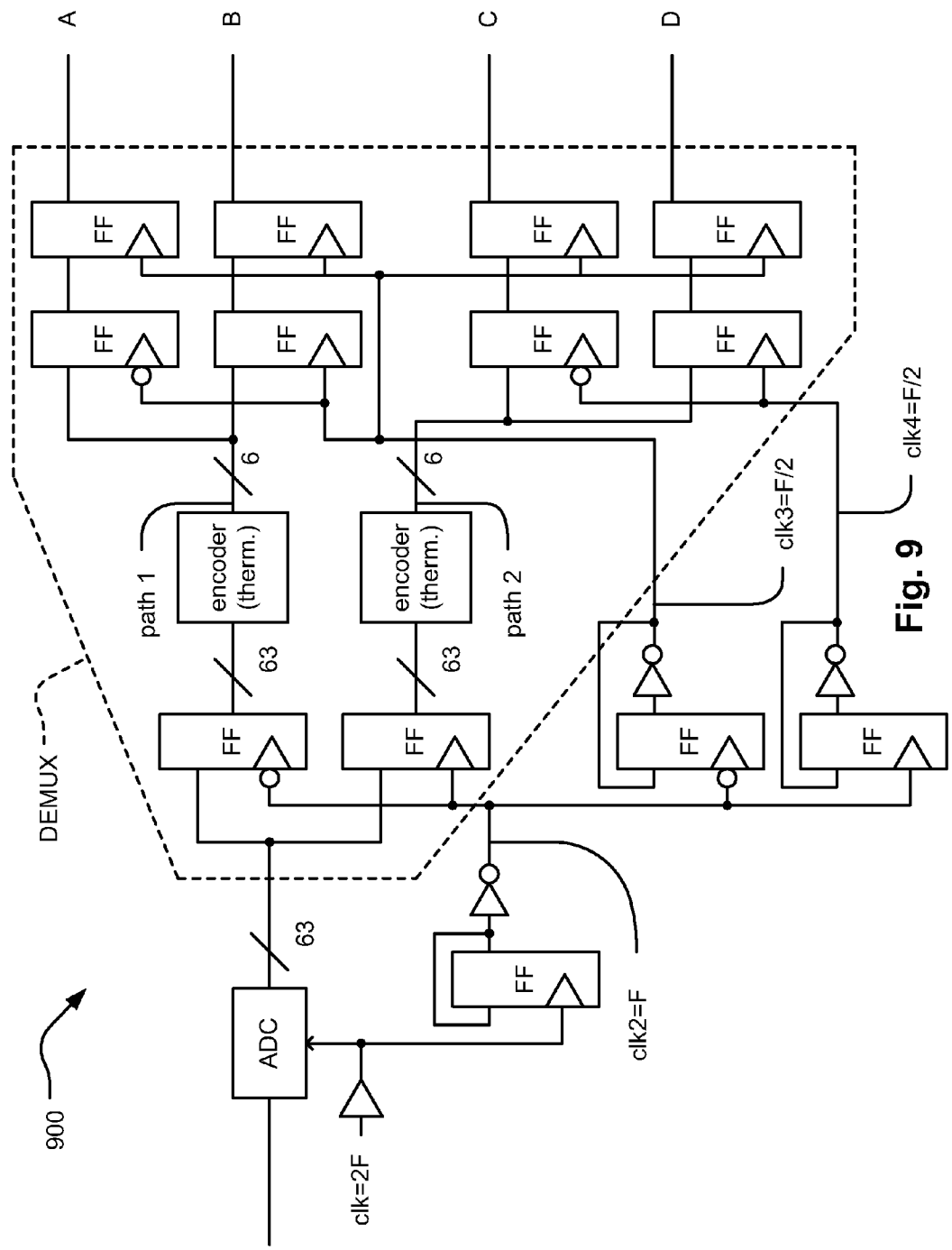
FIG. 9 illustrates an embodiment of a multi-stage demultiplexing and thermometer encoding.

FIG. 9 illustrates an embodiment of a multi-stage demultiplexing and thermometer encoding 800. This embodiment includes an ADC that digitally samples a signal at a first clock (e.g., shown as clk=2F). A first de-multiplexing stage includes a number of flip-flops (FFs) and a number of thermometer encoders. This embodiment shows the first de-multiplexing stage having 2 FFs and 2 thermometer encoders, though more FFs and/or thermometer encoders could also be employed in other embodiments.

Within the first de-multiplexing stage, a first FF, that is clocked at a second clock, receives the digitally sampled signal from the ADC. Also, a second FF, that is clocked at an inverted version of the second clock, receives the digitally sampled signal from the ADC. A first thermometer encoder transforms thermometer coded data output from the first FF to binary data, and a second thermometer encoder transforms thermometer coded data output from the second FF of the first plurality of FFs to binary data.

The first de-multiplexing stage is coupled to a second de-multiplexing stage, and the second de-multiplexing stage also includes a number of FFs. Within the second de-multiplexing stage, a first FF, that is clocked at a third clock that is generated using the first clock, receives the binary data output from the first thermometer encoder. Also within the second de-multiplexing stage, a second FF, that is clocked at an inverted version of the third clock, receives the binary data output from the first thermometer encoder. A third FF (in the second de-multiplexing stage), that is clocked at a fourth clock that is generated using the second clock, receives the binary data output from the second thermometer encoder, and a fourth FF (in the second de-multiplexing stage), that is clocked at an inverted version of the fourth clock, receives the binary data output from the second thermometer encoder. Then, de-multiplexed binary data (shown as A, B, C, and D) are output from the FFs within the second de-multiplexing stage.

The apparatus of this diagram is implemented to perform combined thermometer-to-binary demultiplexing and encoding. The signal received by the ADC may be viewed as being thermometer coded data, and this thermometer coded data is output from the ADC to each of the first FF and the second FF of the first de-multiplexing stage. This input thermometer coded data is de-multiplexed using the rising and falling edge of a divide by 2 clock (e.g., a second clock signal, that is shown as clk2, which has a frequency F that is one half of the first clock signal at which the ADC is clocked).

Other implemented FFs operate to generate a third clock signal and a fourth clock signal based on the second clock signal that are used to clock the FFs of the second de-multiplexing stage. Each of the third clock signal and the fourth clock signal have a frequency of F/2, which is one-fourth of the first clock signal and one-half of the second clock signal.

Figure 10:
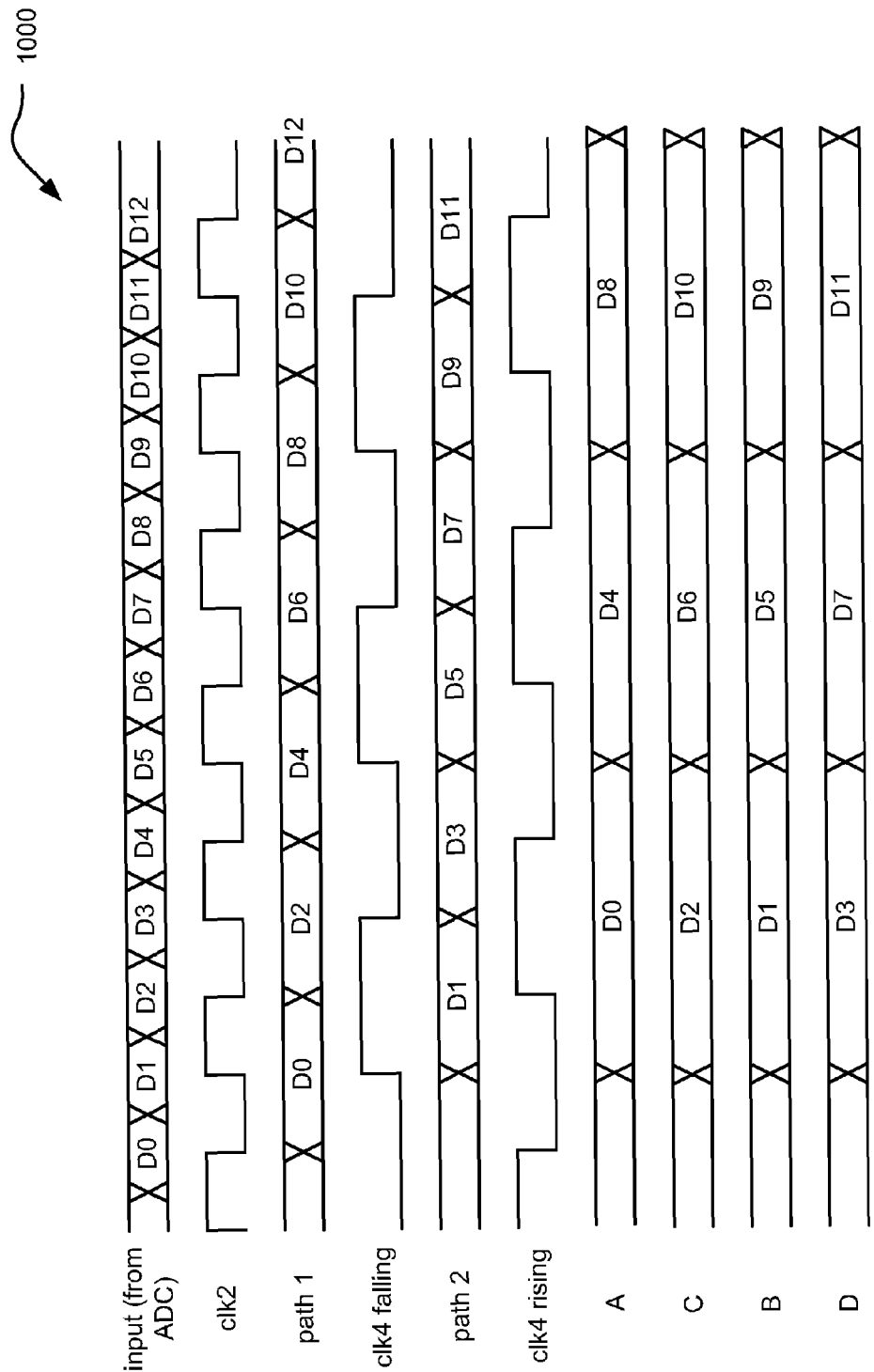
FIG. 10 illustrates an embodiment of a timing diagram of signals within FIG. 9.

The outputs to the second de-multiplexing stage, shown at path 1 and path 2 in the diagram, are not aligned to one clock domain and are output relative to the respective rising or falling clock edges as shown in the timing diagram of FIG. 10.

FIG. 10 illustrates an embodiment of a timing diagram 1000 of signals within FIG. 9.

Considering FIG. 9 and FIG. 10 in conjunction with one another and considering an embodiment of the first de-multiplexing stage that operates on 63-bit thermometer coded data, the 63-bit thermometer coded data is passed through a combinational logic bubble detector and encoder that converts the 63-bit thermometer coded data to a binary signal, which may be 6-bits in one embodiment. Such an embodiment of a second de-multiplexing stage then de-multiplexes the output using a divided down clock (e.g., shown as clk3 and clk4) relative to the edge the data was output from the first de-multiplexing stage.

For example, path 1 would use the divided down clock relative to the falling edge and path 2 would use the divided down clock relative to the rising edge. This increases the timing margin to the second de-multiplexing stage by ½F (or F/2) where F is the input clock frequency. This additional clock domain (or second clock domain) allows the thermometer to binary encoder to be placed as close to the input as possible reducing the overall number of components, area and while providing for reduced power consumption. The final de-multiplexed output is retimed to one final clock domain before being transmitted out as can be seen in the timing diagram 1000 of FIG. 10.

The embodiment of FIG. 9 (whose timing diagram 1000 is shown in FIG. 10) modifies the architecture depicted in FIG. 8 by replacing the input DEMUX stage from 5 latches with a DEMUX of 4 latches and having the last DEMUX stage consist of 8 latches compared to 5.

Performing analogous power calculations as shown above, the estimated power for this embodiment is as follows:

$P=(N_{bits})\times(\text{\# of latches})\times(\text{frequency})$.

$P=63\times4\times F+6\times16\times(F/2)=300F.$

This is a power savings of 52% compared to the prior art embodiment 601 of FIG. 6A, and a power savings of 20% compared to the embodiment 800 of FIG. 8.

Comparing this embodiment of FIG. 9 (whose timing diagram 1000 is shown in FIG. 10) to the prior art embodiment of FIG. 6A that employs 5 latches and outputs the data on a common clock edge, the embodiment of FIG. 9 removes one of the latches and allows the data to be output on both rising and falling clock edges. The removal of the extra high speed latch at the input stage reduces the power and area significantly.

In this embodiment of FIG. 9, the use of two different clock domains for the second DEMUX stage increases the timing margin between the first DEMUX through the thermometer-to-binary encoder into the second DEMUX. The increase in timing margin is T, where T is the period of the input data/clock.

The thermometer-to-binary coders are placed very close to the input stage to convert the 63-bit lines to 6-bits as to reduce the number of processing components (area) and power.

Also, each DEMUX encoder contains its own, independent clock generator to remove the timing requirements between each ADC channel and the potential of race conditions along the various paths. Further details of this distributed clock generation architecture are also described with reference to FIG. 12. Such a reset and time-interleaving is controlled on the ADC clock generator where it is local and well controlled.

Figure 11:
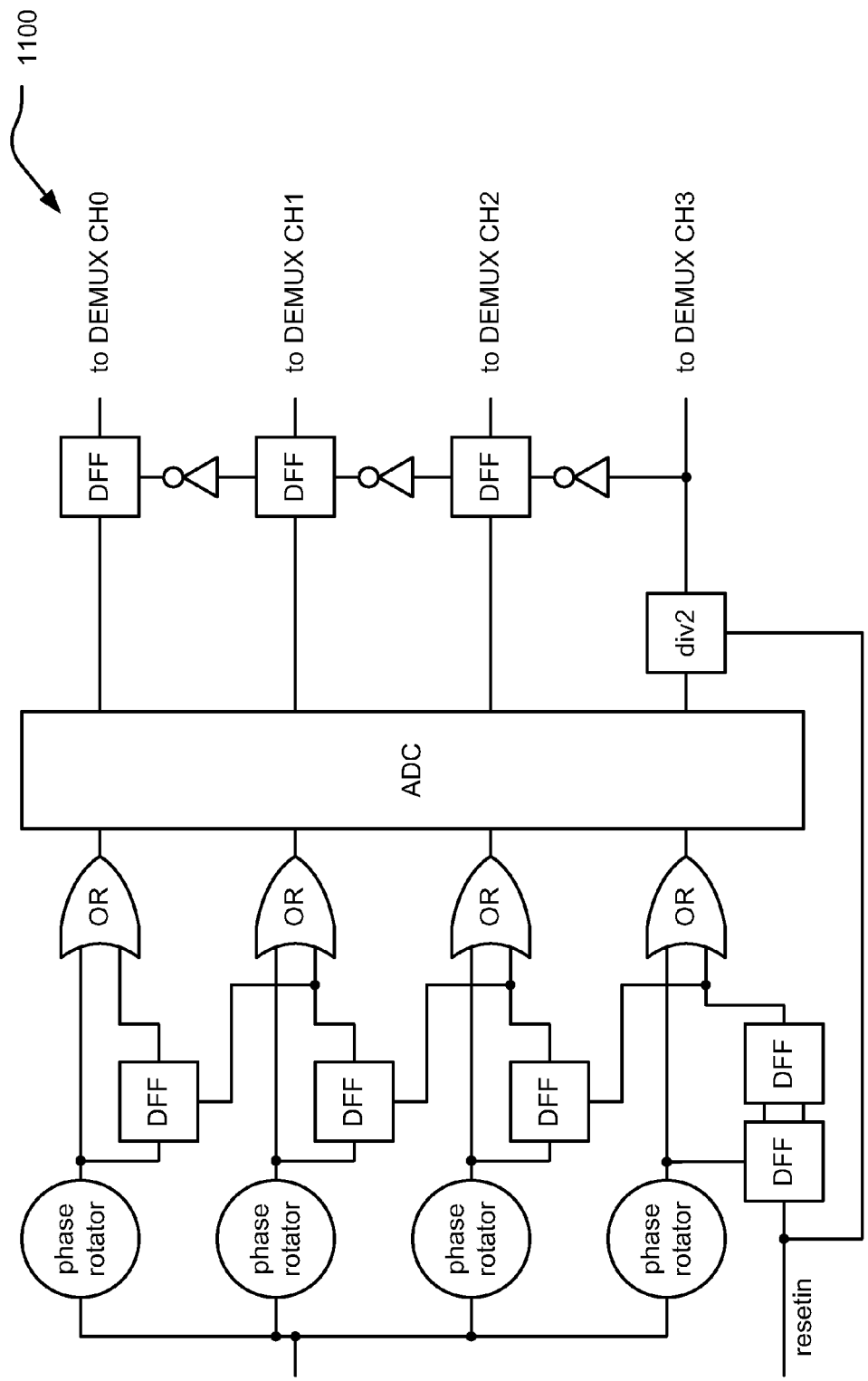
FIG. 11 illustrates an embodiment of time-interleaved clock path and reset within an apparatus employing a single divider with vertical timing.

FIG. 11 illustrates an embodiment of time-interleaved clock path and reset within an apparatus 1100 employing a single divider with vertical timing. Within a multi-channel architecture that employs a number of DEMUXs, the time-interleaved nature of the ADC requires each of the DEMUX encoder clock domains to be well defined and maintained.

The apparatus 1100 employs one re-settable clock divider (e.g., shown as div2) to generate all the frequency clock domains. The apparatus then retimes them using a number of D-flip-flops (DFFs) for each time-interleaved ADC and DEMUX encoder (FIG. 4a). This inherently creates dependency between each DEMUX encoder and requires that the entire clock chain to be operational at all times, regardless of the current operating mode. In addition, this raises the potential for race conditions due to the various clock paths and process variations across the clock network.

Figure 12:
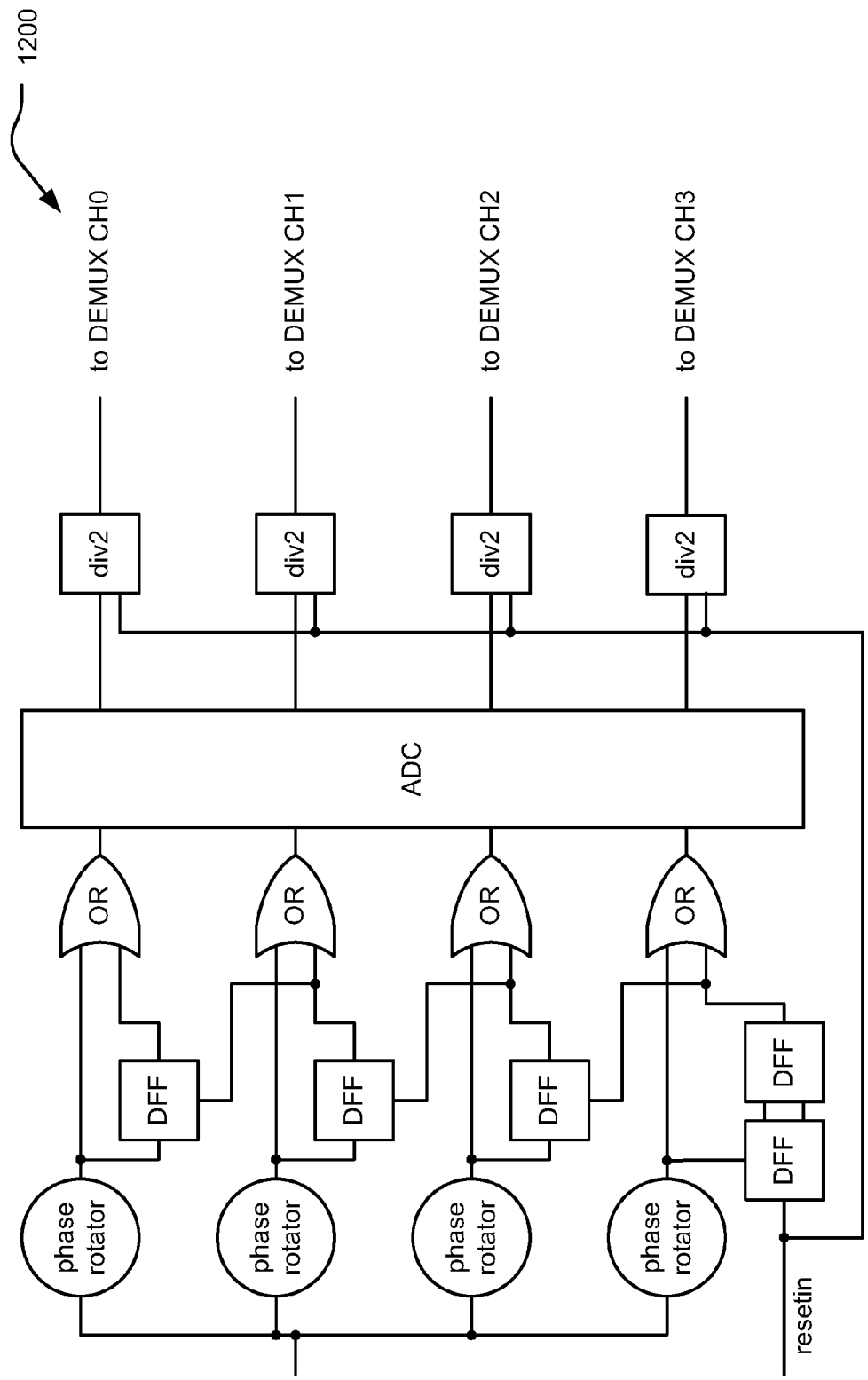
FIG. 12 illustrates an embodiment of time-interleaved clock path and reset within an apparatus employing multiple, distributed dividers having coordinated startup.

FIG. 12 illustrates an embodiment of time-interleaved clock path and reset within an apparatus 1200 employing multiple, distributed dividers having coordinated startup. Again, within a multi-channel architecture that employs a number of DEMUXs, the time-interleaved nature of the ADC requires each of the DEMUX/encoder clock domains to be well defined and maintained.

In contrast to the embodiment employed in the previous embodiment, the apparatus 1200 employs a different reset and clock path in which each DEMUX encoder has an independent divider to locally generate the required clocks (e.g., shown as the distributed div2 modules). The start up condition for the DEMUX clock generator, however, has to be coordinated by the time-interleaved clock generator in order to maintain a known timing relationship between the various ADC channels.

With respect to the novel architecture and approaches presented herein, it is noted that this architecture can be used for any ADC bus size for the thermometer or binary code. The larger the thermometer code, the more significant the power and space savings provided using the novel architecture and approaches presented herein. Furthermore, novel architecture and approaches presented herein can operate at any data rate. Consequently, the faster the data rate employed within the first stage, the larger the power savings. While many of the illustrative embodiments also depict a DEMUX level of 1 to 4, it is clearly noted that any desired DEMUX level can be employed (e.g., greater than 1 to 4, including a DEMUX level of 1 to 16 or a DEMUX level of 1 to 32 could also work).

Figure 13:
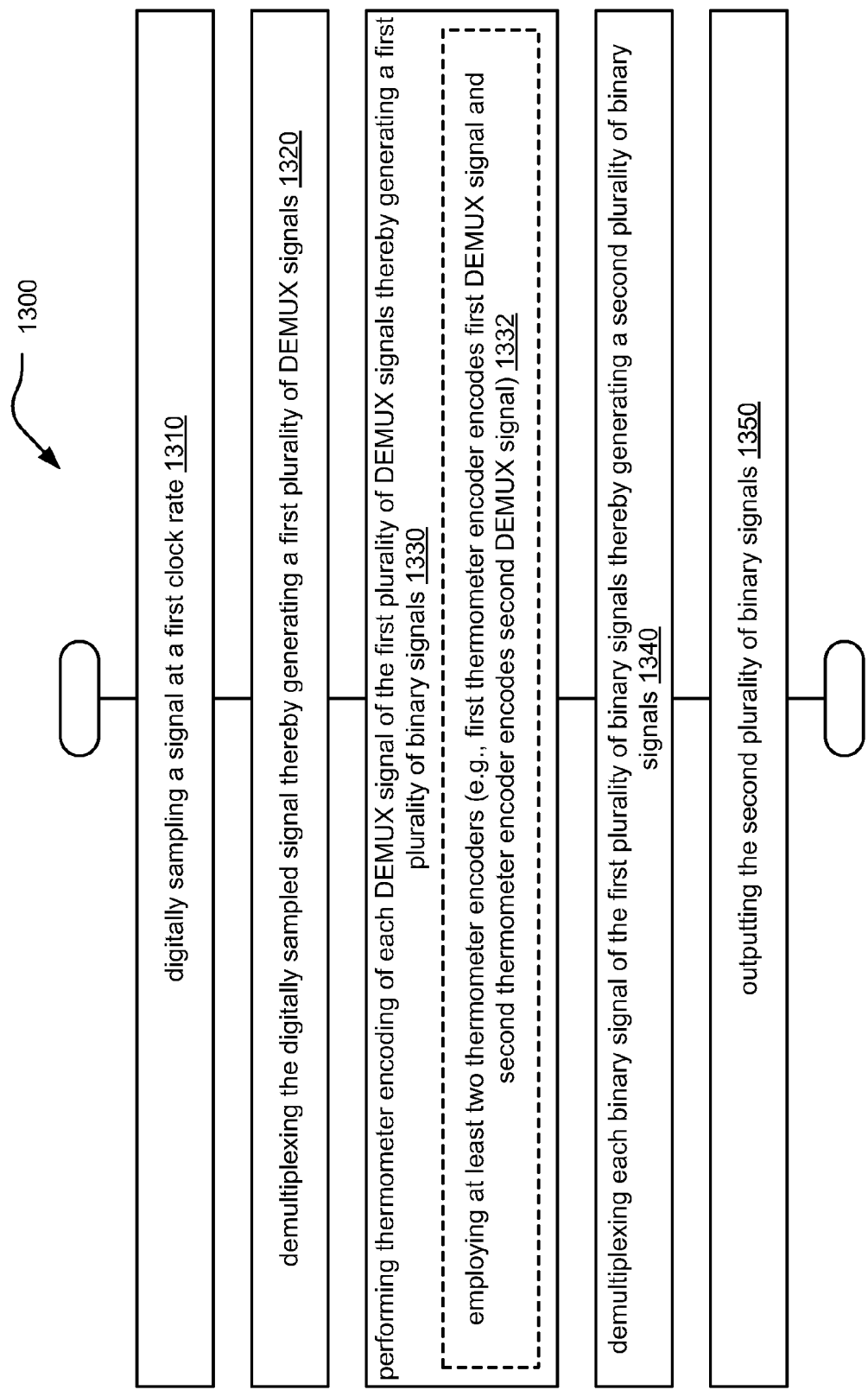
FIG. 13 illustrates an embodiment of a method for demultiplexing and thermometer encoding.

FIG. 13 illustrates an embodiment of a method 1300 for demultiplexing and thermometer encoding. The method 1300 begins by digitally sampling a signal at a first clock rate, as shown in a block 1310.

The method 1300 continues by demultiplexing the digitally sampled signal thereby generating a first plurality of DEMUX signals, as shown in a block 1320.

The method 1300 continues by performing thermometer encoding of each DEMUX signal of the first plurality of DEMUX signals thereby generating a first plurality of binary signals, as shown in a block 1330. If desired, as shown by block 1332, the method 1300 can operate by employing at least two thermometer encoders (e.g., first thermometer encoder encodes first DEMUX signal and second thermometer encoder encodes second DEMUX signal).

The method 1300 continues by demultiplexing each binary signal of the first plurality of binary signals thereby generating a second plurality of binary signals, as shown in a block 1340. The method 1300 continues by outputting the second plurality of binary signals, as shown in a block 1350.

It is noted that the various modules (e.g., encoding modules, decoding modules, thermometer encoding modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
an analog to digital converter (ADC) that digitally samples a signal at a first clock;
a first de-multiplexing stage that includes a first plurality of flip-flops (FFs) and a plurality of thermometer encoders, wherein:
a first FF of the first plurality of FFs, that is clocked at a second clock, receives the digitally sampled signal from the ADC;

a second FF of the first plurality of FFs, that is clocked at an inverted version of the second clock, receives the digitally sampled signal from the ADC;

a first thermometer encoder of the plurality of thermometer encoders transforms thermometer coded data output from the first FF of the first plurality of FFs to binary data; and a second thermometer encoder of the plurality of thermometer encoders transforms thermometer coded data output from the second FF of the first plurality of FFs to binary data; and a second de-multiplexing stage that includes a second plurality of FFs, wherein:

a first FF of the second plurality of FFs, that is clocked at a third clock that is generated using the second clock, receives the binary data output from the first thermometer encoder;

a second FF of the second plurality of FFs, that is clocked at an inverted version of the third clock, receives the binary data output from the first thermometer encoder;

a third FF of the second plurality of FFs, that is clocked at a fourth clock that is generated using the second clock, receives the binary data output from the second thermometer encoder; and a fourth FF of the second plurality of FFs, that is clocked at an inverted version of the fourth clock, receives the binary data output from the second thermometer encoder; and wherein:

de-multiplexed binary data are output from the second plurality of FFs.

2. The apparatus of claim 1, wherein:
a rate of the second clock is one-half of a rate of the first clock; and
a rate of the third clock is one-half of a rate of the second clock.

3. The apparatus of claim 1, wherein:
the second plurality of FFs includes:
a fifth FF, coupled to the first FF of the second plurality of FFs, that outputs binary data there from on a falling edge or rising edge of the third clock; and
a sixth FF, coupled to the second FF of the second plurality of FFs, that outputs binary data there from on a falling edge or rising edge of the third clock.

4. The apparatus of claim 1, wherein:
the second plurality of FFs includes:
a fifth FF, coupled to the third FF of the second plurality of FFs, that outputs binary data there from on a falling edge or rising edge of the fourth clock; and
a sixth FF, coupled to the fourth FF of the second plurality of FFs, that outputs binary data there from on a falling edge or rising edge of the fourth clock.

5. The apparatus of claim 1, wherein:
the second plurality of FFs includes:
a fifth FF, coupled to the first FF of the second plurality of FFs, that outputs binary data there from on a falling edge or rising edge of the third clock;
a sixth FF, coupled to the second FF of the second plurality of FFs, that outputs binary data there from on a falling edge or rising edge of the third clock;
a seventh FF, coupled to the third FF of the second plurality of FFs, that outputs binary data there from on a falling edge or rising edge of the fourth clock;
a eighth FF, coupled to the fourth FF of the second plurality of FFs, that outputs binary data there from on a falling edge or rising edge of the fourth clock; and the fifth FF, the sixth FF, the seventh FF, and the eighth FF output their corresponding binary data simultaneously with one another.

6. The apparatus of claim 1, wherein:
the first FF of the second plurality of FFs and the second FF of the second plurality of FFs operate within a first clock domain; and
the third FF of the second plurality of FFs and the fourth FF of the second plurality of FFs operate within a second clock domain.

7. The apparatus of claim 1, wherein:
only the first FF of the first plurality of FFs is interposed between the first thermometer encoder and the ADC; and
only the second FF of the first plurality of FFs is interposed between the second thermometer encoder and the ADC.

8. The apparatus of claim 1, wherein:
the first de-multiplexing stage and the second de-multiplexing stage cooperatively support a 1 to N de-multiplex level; and
N is an integer.

9. The apparatus of claim 1, further comprising:
a plurality of distributed clock generators implemented to generate the third clock and the fourth clock; and wherein:
each distributed clock generator of the distributed clock generators is reset simultaneously.

10. The apparatus of claim 1, wherein:
the apparatus is implemented within a communication device; and
the communication device is implemented within at least one of a satellite communication system, a wireless communication system, a wired communication system, and a fiber-optic communication system.

11. An apparatus, comprising:
a plurality of distributed clock generators implemented to generate a plurality of clock signals including the first clock, wherein:
each distributed clock generator of the distributed clock generators is reset simultaneously;
the plurality of clock signals includes a first clock, a second clock, a third clock, and a fourth clock;
an analog to digital converter (ADC) that digitally samples a signal at the first clock;
a first de-multiplexing stage that includes a first plurality of flip-flops (FFs) and a plurality of thermometer encoders, wherein:
a first FF of the first plurality of FFs, that is clocked at the second clock, receives the digitally sampled signal from the ADC;
a second FF of the first plurality of FFs, that is clocked at an inverted version of the second clock, receives the digitally sampled signal from the ADC;
a first thermometer encoder of the plurality of thermometer encoders transforms thermometer coded data output from the first FF of the first plurality of FFs to binary data; and
a second thermometer encoder of the plurality of thermometer encoders transforms thermometer coded data output from the second FF of the first plurality of FFs to binary data; and
a second de-multiplexing stage that includes a second plurality of FFs, wherein:
a first FF of the second plurality of FFs, that is clocked at a third clock, receives the binary data output from the first thermometer encoder;

a second FF of the second plurality of FFs, that is clocked at an inverted version of the third clock, receives the binary data output from the first thermometer encoder;

a third FF of the second plurality of FFs, that is clocked at a fourth clock, receives the binary data output from the second thermometer encoder; and a fourth FF of the second plurality of FFs, that is clocked at an inverted version of the fourth clock, receives the binary data output from the second thermometer encoder; and wherein:

de-multiplexed binary data are output from the second plurality of FFs;

only the first FF of the first plurality of FFs is interposed between the first thermometer encoder and the ADC; and only the second FF of the first plurality of FFs is interposed between the second thermometer encoder and the ADC.

12. The apparatus of claim 11, wherein:

a rate of the second clock is one-half of a rate of the first clock; and a rate of the third clock is one-half of a rate of the second clock.

13. The apparatus of claim 11, wherein:

the second plurality of FFs includes:

a fifth FF, coupled to the first FF of the second plurality of FFs, that outputs binary data there from on a falling edge or rising edge of the third clock;

a sixth FF, coupled to the second FF of the second plurality of FFs, that outputs binary data there from on a falling edge or rising edge of the third clock;

a seventh FF, coupled to the third FF of the second plurality of FFs, that outputs binary data there from on a falling edge or rising edge of the fourth clock;

a eighth FF, coupled to the fourth FF of the second plurality of FFs, that outputs binary data there from on a falling edge or rising edge of the fourth clock; and the fifth FF, the sixth FF, the seventh FF, and the eighth FF output their corresponding binary data simultaneously with one another.

14. The apparatus of claim 11, wherein:

the first FF of the second plurality of FFs and the second FF of the second plurality of FFs operate within a first clock domain; and the third FF of the second plurality of FFs and the fourth FF of the second plurality of FFs operate within a second clock domain.

15. The apparatus of claim 11, wherein:

the first de-multiplexing stage and the second de-multiplexing stage cooperatively support a 1 to N de-multiplex level; and N is an integer.

16. The apparatus of claim 11, wherein:

the apparatus is implemented within a communication device; and the communication device is implemented within at least one of a satellite communication system, a wireless communication system, a wired communication system, and a fiber-optic communication system.

17. An apparatus, comprising:

an analog to digital converter (ADC) that digitally samples a signal at a first clock;

a first de-multiplexing stage that includes a first plurality of flip-flops (FFs) and a plurality of thermometer encoders, wherein:

a first FF of the first plurality of FFs, that is clocked at a second clock, receives the digitally sampled signal from the ADC;

a second FF of the first plurality of FFs, that is clocked at an inverted version of the second clock, receives the digitally sampled signal from the ADC;

a first thermometer encoder of the plurality of thermometer encoders transforms thermometer coded data output from the first FF of the first plurality of FFs to binary data; and a second thermometer encoder of the plurality of thermometer encoders transforms thermometer coded data output from the second FF of the first plurality of FFs to binary data; and a second de-multiplexing stage that includes a second plurality of FFs, wherein:

a first FF of the second plurality of FFs, that is clocked at a third clock that is generated using the second clock, receives the binary data output from the first thermometer encoder;

a second FF of the second plurality of FFs, that is clocked at an inverted version of the third clock, receives the binary data output from the first thermometer encoder;

a third FF of the second plurality of FFs, that is clocked at a fourth clock that is generated using the second clock, receives the binary data output from the second thermometer encoder; and a fourth FF of the second plurality of FFs, that is clocked at an inverted version of the fourth clock, receives the binary data output from the second thermometer encoder; and wherein:

de-multiplexed binary data are output from the second plurality of FFs;

the first FF of the second plurality of FFs and the second FF of the second plurality of FFs operate within a first clock domain;

the third FF of the second plurality of FFs and the fourth FF of the second plurality of FFs operate within a second clock domain;

a rate of the second clock is one-half of a rate of the first clock;

a rate of the third clock is one-half of a rate of the second clock;

the first de-multiplexing stage and the second de-multiplexing stage cooperatively support a 1 to N de-multiplex level; and N is an integer.

18. The apparatus of claim 17, further comprising:

a plurality of distributed clock generators implemented to generate the third clock and the fourth clock; and wherein:

each distributed clock generator of the distributed clock generators is reset simultaneously.

19. The apparatus of claim 17, wherein:

the second plurality of FFs includes:

a fifth FF, coupled to the first FF of the second plurality of FFs, that outputs binary data there from on a falling edge or rising edge of the third clock;

a sixth FF, coupled to the second FF of the second plurality of FFs, that outputs binary data there from on a falling edge or rising edge of the third clock;

a seventh FF, coupled to the third FF of the second plurality of FFs, that outputs binary data there from on a falling edge or rising edge of the fourth clock;
a eighth FF, coupled to the fourth FF of the second plurality of FFs, that outputs binary data there from on a falling edge or rising edge of the fourth clock;
the fifth FF, the sixth FF, the seventh FF, and the eighth FF output their corresponding binary data simultaneously with one another;
only the first FF of the first plurality of FFs is interposed between the first thermometer encoder and the ADC; and only the second FF of the first plurality of FFs is interposed between the second thermometer encoder and the ADC.

20. The apparatus of claim 17, wherein:

the apparatus is implemented within a communication device; and the communication device is implemented within at least one of a satellite communication system, a wireless communication system, a wired communication system, and a fiber-optic communication system.

* * * * *